(12) United States Patent
Shao et al.

(10) Patent No.: US 10,153,654 B2
(45) Date of Patent: Dec. 11, 2018

(54) METHOD, SYSTEM AND APPARATUS FOR WIRELESS CHARGING NOTIFICATION

(71) Applicant: Intel Corporation, Santa Clara, CA (US)

(72) Inventors: Lei Shao, Sunnyvale, CA (US); Xintian E. Lin, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 527 days.

(21) Appl. No.: 14/978,977

(22) Filed: Dec. 22, 2015

(65) Prior Publication Data

US 2017/0179752 A1    Jun. 22, 2017

(51) Int. Cl.
| | |
|---|---|
| *H02J 7/02* | (2016.01) |
| *G01R 31/36* | (2006.01) |
| *H02J 50/12* | (2016.01) |
| *H02J 7/00* | (2006.01) |
| *H02J 50/80* | (2016.01) |
| *H04B 5/00* | (2006.01) |

(52) U.S. Cl.
CPC .......... *H02J 7/025* (2013.01); *G01R 31/3627* (2013.01); *G01R 31/3689* (2013.01); *H02J 7/0047* (2013.01); *H02J 50/12* (2016.02); *H02J 50/80* (2016.02); *H04B 5/0037* (2013.01); *H04B 5/0081* (2013.01); *H02J 2007/0096* (2013.01); *H04B 5/0031* (2013.01); *Y02B 40/90* (2013.01)

(58) Field of Classification Search
CPC .......... H02J 7/025; H02J 50/12; H02J 7/0047; H02J 2007/0096; H02J 50/80; G01R 31/3627; G01R 31/3689; Y02B 40/90; H04B 5/0031; H04B 5/0037; H04B 5/0081

See application file for complete search history.

(56) References Cited

U.S. PATENT DOCUMENTS

| | | | |
|---|---|---|---|
| 2012/0306433 A1 | 12/2012 | Kim et al. | |
| 2013/0134927 A1* | 5/2013 | Park | H04B 5/0037 320/107 |
| 2015/0054458 A1 | 2/2015 | Yoon et al. | |

FOREIGN PATENT DOCUMENTS

| | | |
|---|---|---|
| KR | 10-2013-0124698 A | 11/2013 |
| KR | 10-2014-0054629 A | 5/2014 |

OTHER PUBLICATIONS

International Search Report and Written opinion received for International application No. PCT/US2016/061765, dated Feb. 28, 2017, 12 pages.

(Continued)

*Primary Examiner* — Robert Deberadinis
(74) *Attorney, Agent, or Firm* — Spectrum IP Law Group LLC

(57) ABSTRACT

The disclosure generally relates to methods, system and apparatus to optimize wireless charging by providing user notification when wireless charging efficiency is compromised. In an exemplary embodiment, the charging efficiency value of a device under charge (DUC) is calculated. When the charging efficiency value drops below a predefined threshold, the user is notified to relocate the DUC to a new location with respect to the Power Transmission Unit (PTU) to enhance charging efficiency. In another embodiment, a PTU charging efficiency map is generated to help guide the user for optimal wireless charging.

22 Claims, 6 Drawing Sheets

(56) References Cited

OTHER PUBLICATIONS

International Preliminary Report on Patentability received for International Application No. PCT/US2016/061765, dated Jul. 5, 2018, 9 pages.

* cited by examiner

METHOD, SYSTEM AND APPARATUS FOR WIRELESS CHARGING NOTIFICATION

BACKGROUND

Field

The disclosure generally relates to a method, system and apparatus to optimize wireless charging. Specifically, the specification relates to methods, system and apparatus to optimize wireless charging by providing user notification when wireless charging efficiency is compromised.

Description of Related Art

Wireless charging or inductive charging uses a magnetic field to transfer energy between two devices. Wireless charging can be implemented at a charging station. Energy is sent from one device to another device through an inductive coupling. The inductive coupling is used to charge batteries or run the receiving device. The Alliance for Wireless Power (A4WP) was formed to create industry standard to deliver power through non-radiative, near field, magnetic resonance from the Power Transmitting Unit (PTU) to a Power Receiving Unit (PRU).

The A4WP defines five categories of PRU parameterized by the maximum power delivered out of the PRU resonator. Category 1 is directed to lower power applications (e.g., Bluetooth headsets). Category 2 is directed to devices with power output of about 3.5 W and Category 3 devices have an output of about 6.5 W. Categories 4 and 5 are directed to higher-power applications (e.g., tablets, netbooks and laptops).

PTUs of A4WP use an induction coil to generate a magnetic field from within a charging base station, and a second induction coil in the PRU (i.e., portable device) takes power from the magnetic field and converts the power back into electrical current to charge the battery. In this manner, the two proximal induction coils form an electrical transformer. Greater distances between sender and receiver coils can be achieved when the inductive charging system uses magnetic resonance coupling. Magnetic resonance coupling is the near field wireless transmission of electrical energy between two coils that are tuned to resonate at the same frequency.

Wireless charging is particularly important for fast charging of devices including smartphones, tablets and laptops. There is a need for improved wireless charging systems to extend the active charging area and to improve coupling and charging uniformity while avoiding disruption of nearby devices that may interfere with the generated magnetic field.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
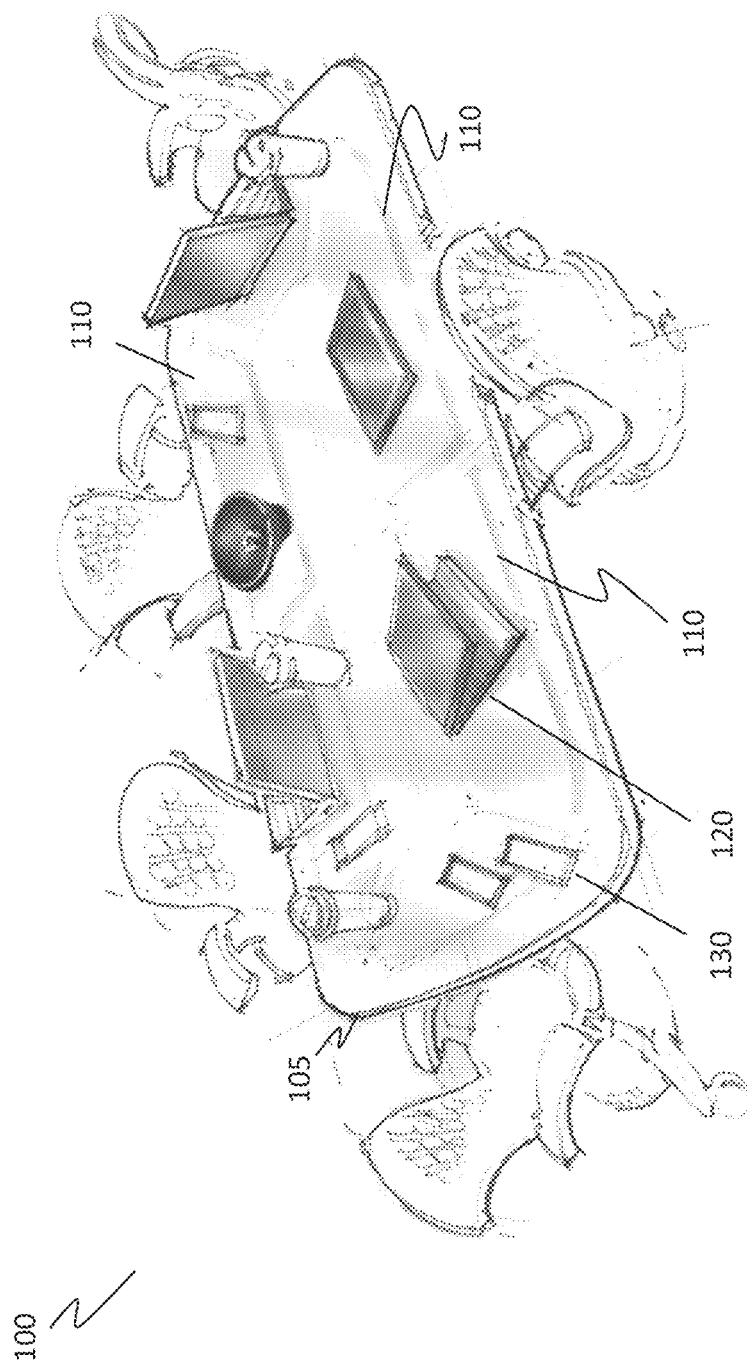
FIG. 1 illustrates an exemplary wireless charging environment according to one embodiment of the disclosure.

Certain embodiments may be used in conjunction with various devices and systems, for example, a mobile phone, a smartphone, a laptop computer, a sensor device, a Bluetooth (BT) device, an Ultrabook™, a notebook computer, a tablet computer, a handheld device, a Personal Digital Assistant (PDA) device, a handheld PDA device, an on board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (AV) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with devices and/or networks operating in accordance with existing Institute of Electrical and Electronics Engineers (IEEE) standards (IEEE 802.11-2012, IEEE Standard for Information technology—Telecommunications and information exchange between systems Local and metropolitan area networks—Specific requirements Part 11: Wireless LAN Medium Access Control (MAC) and Physical Layer (PHY) Specifications, Mar. 29, 2012; IEEE 802.11 task group ac (TGac) ("IEEE 802.11-09/0308r12—TGac Channel Model Addendum Document"); IEEE 802.11 task group ad (TGad) (IEEE 802.11ad-2012, IEEE Standard for Information Technology and brought to market under the WiGig brand—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band, 28 Dec. 2012)) and/or future versions and/or derivatives thereof, devices and/or networks operating in accordance with existing Wireless Fidelity (Wi-Fi) Alliance (WFA) Peer-to-Peer (P2P) specifications (Wi-Fi P2P technical specification, version 1.2, 2012) and/or future versions and/or derivatives thereof, devices and/or networks operating in accordance with existing cellular specifications and/or protocols, e.g., 3rd Generation Partnership Project (3GPP), 3GPP Long Term Evolution (LTE), and/or future versions and/or derivatives thereof, devices and/or networks operating in accordance with existing Wireless HDTM specifications and/or future versions and/or derivatives thereof, units and/or devices which are part of the above networks, and the like.

Some embodiments may be implemented in conjunction with the BT and/or Bluetooth low energy (BLE) standard. As briefly discussed, BT and BLE are wireless technology standard for exchanging data over short distances using short-wavelength UHF radio waves in the industrial, scientific and medical (ISM) radio bands (i.e., bands from 2400-2483.5 MHz). BT connects fixed and mobile devices by building personal area networks (PANs). Bluetooth uses frequency-hopping spread spectrum. The transmitted data are divided into packets and each packet is transmitted on one of the 79 designated BT channels. Each channel has a bandwidth of 1 MHz. A recently developed BT implementation, Bluetooth 4.0, uses 2 MHz spacing which allows for 40 channels.

Some embodiments may be used in conjunction with one way and/or two-way radio communication systems, a BT device, a BLE device, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like. Some demonstrative embodiments may be used in conjunction with a WLAN. Other embodiments may be used in conjunction with any other suitable wireless communication network, for example, a wireless area network, a "piconet", a WPAN, a WVAN and the like.

Various embodiments of the invention may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

Electromagnetic induction based Wireless charging and Near Field Communication (NFC) are based on inductive coupling between two coils. Wireless charging based on A4WP uses 6.78 MHz industrial, scientific or medical (ISM) frequency band to deliver power between wireless charger and device, while NFC (and some other RFID technologies) uses 13.56 MHz ISM frequency band to deliver power and data between devices.

FIG. 1 illustrates an exemplary wireless charging environment according to one embodiment of the disclosure. In FIG. 1, conference room 100 is shown with wireless charging pads (i.e., PTUs) 110 positioned on desk 105. Each PTU 110 is designated to support one or more PRUs. While FIG. 1 shows PRUs including laptop 120 and smart devices 130, the disclosed principles are not limited thereto and may include any device capable of wireless charging.

Figure 2:
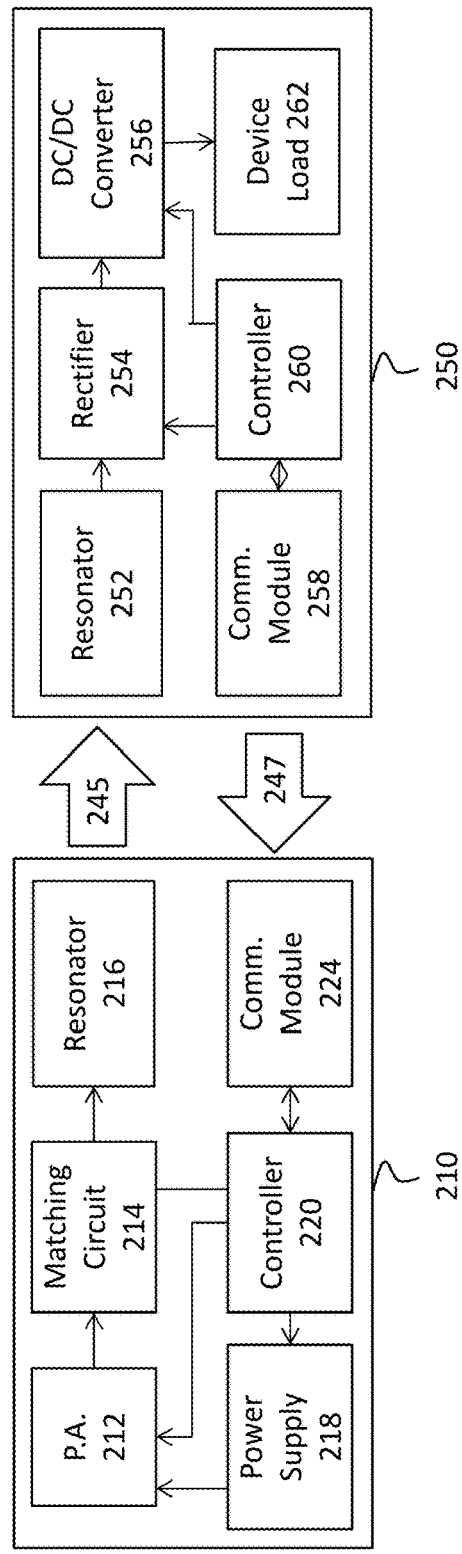
FIG. 2 schematically illustrates conventional A4WP architecture.

FIG. 2 schematically illustrates conventional A4WP architecture. Specifically, FIG. 2 shows PTU 210 and PRU 250. PTU 210 can be any conventional wireless charging station. PTU 210 includes power supply 218, power amplifier (PA) 212, matching circuit 214, controller 220, resonator coil 216 (interchangeably, resonator) and communication module 224. Communication module 224 may define BLE communication platform to transceive BLE packets and to communicate the packets to controller 220. PA 212 receives primary power from power supply 218 (which may be an AC source) and generates an amplified A4WP power signal according to instructions from controller 220. Matching circuit 214 receives A4WP power signals from PA 212 and provides substantially constant power to resonator 216. Resonator 216 may include one or more resonator coils to convert output from matching circuit 214 to magnetic field for a wireless device positioned within the charging zone of PTU 210.

PRU 250 may define any device under charge (DUC) which is proximal to PTU 210. PRU 250 is shown with resonator coil 252, rectifier 254, DC/DC converter 256, communication module 258, controller 260 and device load 262. Communication module 258 includes BLE communication platform to communicate 247 with communication module 224 of PTU 210. Resonator coil 252 receives magnetic field 245 of PTU resonator 216. Rectifier 254 conforms magnetic field (power) received at resonator 252 and provides appropriate signal to DC/DC converter 256. Controller 260 of PRU 250 communicates with resonator 252 and rectifier 254 in order to manage received power. The output of DC/DC converter 256 powers device load (e.g., battery) 262.

Conventional PRUs include smartphones and other devices that are equipped with radio transceivers. The radio transceiver may receive one or more of Frequency Modulation (FM) or Amplitude Modulation (AM) radio signals. Conventional FM radios operate in the frequency spectrum of about 88 to 108 MHz. Many PRUs support and use, for example, FM radio while charging the device. Due to radio frequency interference (RFI) between magnetic field generated for wireless charging and the FM channel being used, the system performance and user experience may be significantly impacted. RFI may be caused by the harmonics of the A4WP power transfer fundamental frequency at 6.78 MHz. The current A4WP specifications does not specify any FM related fields or process to address RFI. In such systems RFI reduces user experience.

In A4WP wireless charging system (class 2 and above), simultaneously charging of multiple PRU devices are supported. Although the general goal of A4WP TX coil design is to provide a uniform electrical-magnetic field to charge the PRU devices under charge, experiments have shown that not every location on the large charging mat of PTU can provide the equally charging efficiency or even satisfactory charging efficiency. Some locations may provide superior electromagnetic power transmission while others may provide a fraction of the desired electromagnetic power. In certain instances, DC/DC charging efficiency for the best location on the charging pad may be 1.6 times of the efficiency of the worst location on the pad. Thus, charging completion time for the worst efficiency location on the charging pad can be 1.6 times longer than that of the best location.

Conventional A4WP system maintains charging information at the PTU. Further, there is a very limited interface between the PTU and the PRU for signaling other latching fault related issues. Conventional A4WP systems do not communicate charging efficiency information. Consequently, the PRU user is unaware that the DUC is positioned at a location which provides inefficient or poor charging. At this location, the DUC may charge very slowly and thereby detract from the user experience. It is desirable to notify user of the charging efficiency values of different locations on the charging pad and give user full control to compare and/or select the best available charging locations.

The disclosed embodiments address these and other deficiencies of the conventional charging systems. Certain embodiments of the disclosure addresses co-existence between magnetic charging field and use of the radio in the DUC (interchangeably, PRU). In an exemplary embodiment, the presence of a DUC at or near a charging mat (i.e., PTU) radio is detected. Once detected, the PTU may determine whether the DUC is being efficiently and/or effectively charged. If the DUC is not being efficiently charged, the PTU may notify the user and, optionally, recommend relocation of the DUC to a new location relative to the PTU.

In one embodiment, the disclosure provides a feedback mechanism to communicate charging efficiency from PTU to the PRU as to the estimate DC:DC charging efficiency. A user associated with the PRU may use this information to interactively adjust the charging position to realize the best charging experience. In an exemplary implementation, the PTU calculates DC:DC charging efficiency based on charging parameters, for example, the rectifier voltage (V_rect) and rectifier current (I_rect) values. These values may be reported by the PRU's BLE connection, as well as the sensor data from PTU's power amplifier. The PTU may then send this information back to PRU through BLE signaling. The charging efficiency information may be used by some wireless charging application on the PRU device to help the user find a suitable charging location on charging pad. The information may even provide the user with a charging efficiency map of the charging pad.

In certain embodiments, the charging efficiency and status information may be uploaded to cloud. The user may then remotely monitor the charging efficiency through user's other devices which are associated with the DUC. For certain wearable device not connected to cloud, special colors or sound indicators may help guide the user to select a suitable charging location on the charging pad. In still another embodiment, the charging efficiency feedback mechanism may be used as an application for performance scanning, testing and device validation.

Figure 3:
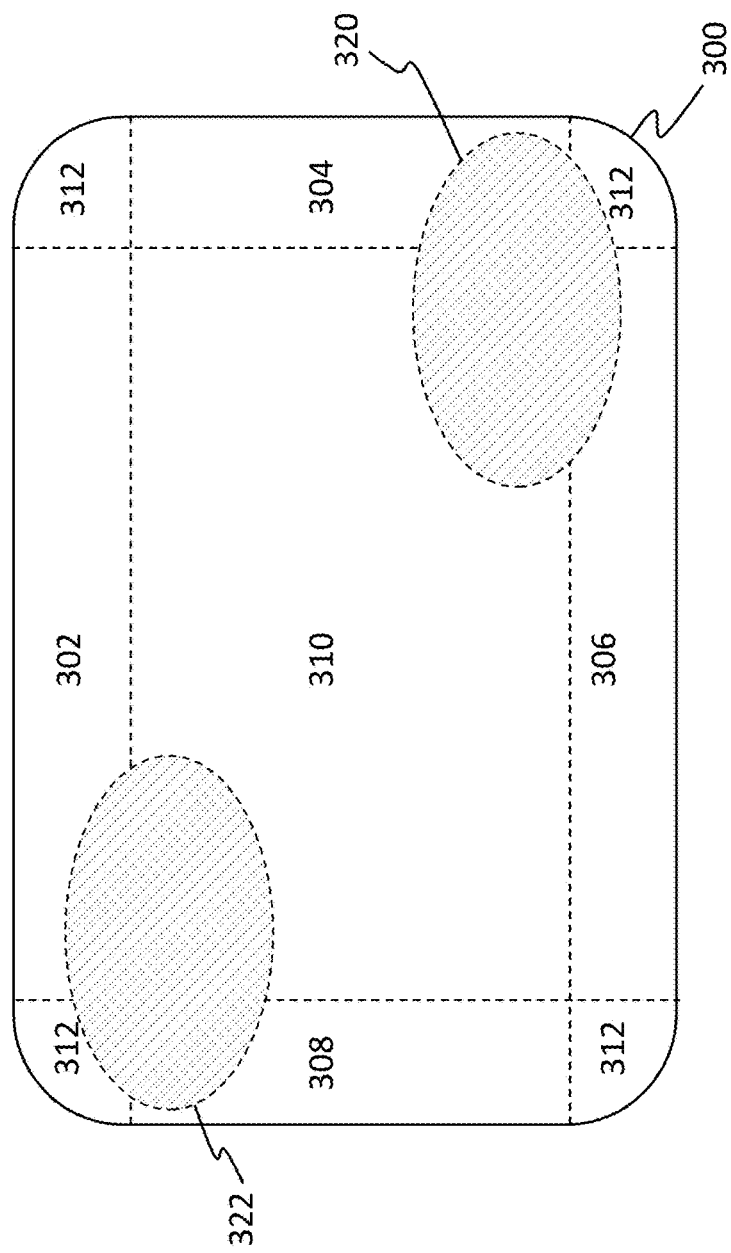
FIG. 3 is a top view of an exemplary PTU charging pad.

FIG. 3 is a top view of an exemplary PTU charging pad. Pad 300 of FIG. 3 is divided into several regions. Region 310, which defines the central portion of pad 300 may provide generally uniform electromagnetic power. Thus, a DUC at region 310 may generally receive optimal wireless charging power. Regions 302, 304, 306 and 308 show the peripheral regions of the charging pad. While the peripheral regions may provide sufficient electromagnetic power, they may not provide optimal charging efficiency. For example, region 304 may provide 30% electromagnetic charging efficiency as compared with central region 310. Regions 312 depict the four corners of charging pad 310 and may represent weak charging regions. For example, regions 312 may provide 20% charging efficiency as compared with central region 310.

Regions 312, 302, 304, 306 and 308 may have the worst charging efficiency. Regions 322 and 312 may have much better compared to regions 312, 302, 304, 306 and 308. For example, regions 320 and 322 may provide 50% charging efficiency as compared with central region 310.

Thus, a DUC placed in regions 312 and 304 may take significantly longer to fully charge as compared with a device positioned at central location 310 or at peripheral regions 322 and 320. User experienced would be diminished by leaving a DUC at regions 312 to find out that little or no electromagnetic charging has occurred. It is highly desirable to notify user the charging efficiency of different locations on charging pad 310 to give user full control to compare and select the best available charging location(s).

In an exemplary embodiment, charging efficiency of each region may be determined as a function of power output of the PTU and the power received at the PRU of the device being charged. For example, DC:DC charging efficiency may be calculated as a function of the current (I_rect) and voltage (V_rect) at the PRU's rectifier (e.g., rectifier 254, FIG. 2) to denote power received at the PRU's rectifier. These values can be measured at the PRU. The PRU may use its BLE communication platform (e.g., comm. module 258, FIG. 2) to communicate these values to the PTU. The PTU may also use other sensor data from its power amplifier (e.g., PA 212, FIG. 2) to calculate power transmission efficiency and the charging value. In one embodiment, the PTU may use the voltage ($V_{PA}$) and current ($I_{PA}$) at the power amplifier for this purpose.

Equation 1 provides an exemplary embodiment for calculating the overall charging efficiency value (η) of the PTU charging all devices under charge:

$$\eta = \text{function}\left(\sum_{k=1}^{n} I_{rect}^{k} * V_{rect}^{k}, V_{PA} * I_{PA}, V, I\right) \quad (1)$$

Where, n is the number of devices under charge by the PTU; Irect is the current at each respective DUC rectifier; Vrect is the voltage at each respective DUC rectifier; VPA is the voltage at the power amplifier of the PTU; IPA is the current at the power amplifier of the PTU and V, I are measured voltage and current values from PTU side. It should be noted that the charging efficiency value of Equation (1) may be determined for all DUCs.

The charging efficiency determination may be implemented using other basis for power send/receive calculation without departing from the disclosed embodiments. Such determination may be made by an application (e.g., applet) or other software running on the PTU. The application may triggered when a new device is detected pursuant to A4WP detection protocols to autonomously determine charging efficiency. In another embodiment, additional or subsequent determinations may be made when the device is moved (e.g., PRU motion sensor indicates movement). In still another embodiment, the determination may be made periodically for each DUC.

Once calculated, the charging efficiency value may then be communicated to the PRU. In certain embodiment, the PTU notifies PRU device of the charging efficiency value (η) of current charging location through BLE signaling message (e.g., signaling 247, FIG. 2).

In one implementation, once charging efficiency information is received at the DUC, it may be retrieved by a wireless charging application so that the device user can participate in the location comparison/selection process. For example, the user may relocate the device if charging efficiency value is below a predetermined threshold. Referring again to FIG. 3, if the user receives indication that the charging efficiency value is about 25% (i.e., significantly below an exemplary predefined threshold value of 80%), the user may be prompted to move the DUC to a location closer to central region 310. A similar charging efficiency determination may be made once the DUC is moved to a new location. In an exemplary embodiment, the PTU will be on all the time and may calculate overall charging efficiency periodically (e.g., every 250 ms).

In an exemplary embodiment, charging efficiency is directly display on the DUC. If the device is not equipped with a display screen, an alarm or other indication may be made at the device or the PTU to notify the user of poor charging efficiency. For example, continuous ringtones can be made as the device is played at a first location having poor charging efficiency. Similarly, an LED display can be integrated with the PTU to readily display charging efficiency as the device is placed on the charging pad. The display may provide numeral values or have red, yellow or green lights displayed to communicate charging efficiency.

Figure 4:
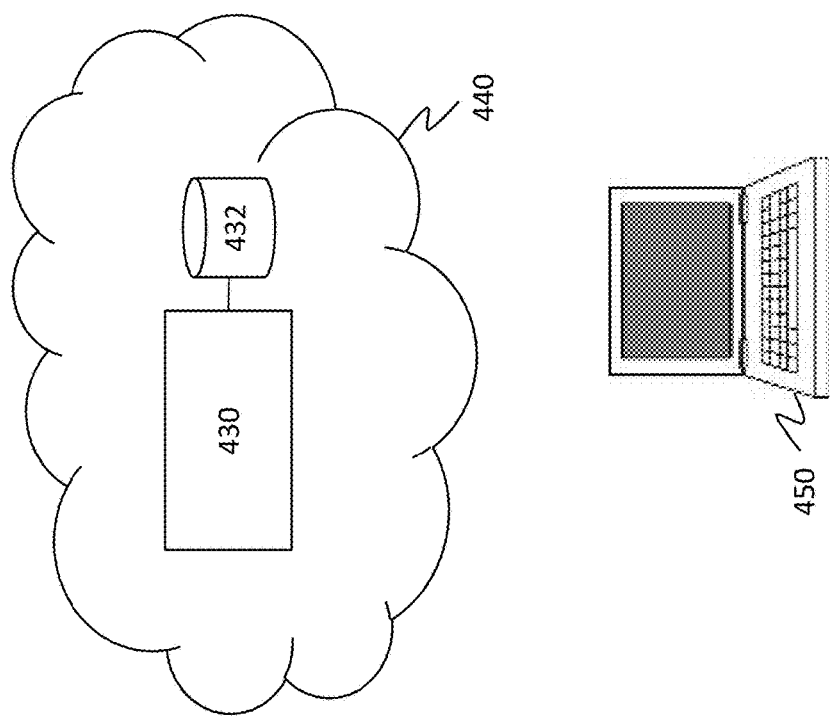
FIG. 4 schematically shows a system for implementing an embodiment of the disclosure.
Figure 4:
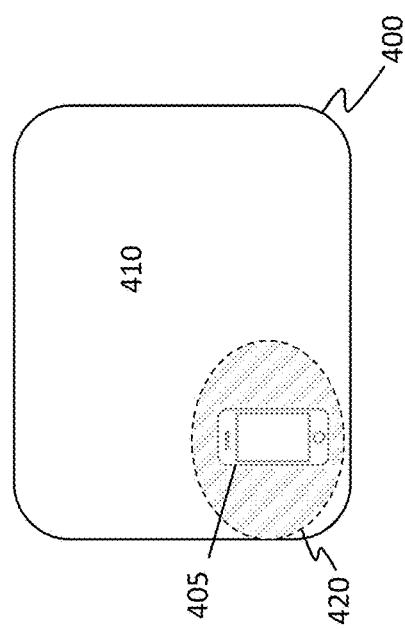

FIG. 4 schematically shows a system for implementing an embodiment of the disclosure. Mobile device 405 is placed on PTU charging pad 400 at location 420. Location 420 has lower charging efficiency as compared with region 410 of charging pad 400. In an exemplary embodiment, charging pad 400 (or the PTU associated therewith) may communicate the charging efficiency value at region 440. Cloud server 440 is schematically shown to include processor 430 and memory 432. Memory 432 may store information and/or instructions for communication and/or execution on processor 430. For example, memory 432 may contain location information for charging pad 400, device information (e.g., make, model, MAC address, etc.) for mobile device 405 and user information (e.g., user name, or other devices associated with the user). Memory 432 may also store charging map for charging pad 400. The charging map (not shown) may be a completion of various locations on the charging pad 400 and its respective charging efficiency. For example, the charging map (not shown) may associate region 420 with subpar charging efficiency while associating region 410 with excellent charging efficiency.

Charging pad 400 may communicate DUC information as well as charging efficiency data to server 440. The information may include conventional device identifiers (e.g., MAC address) which can enable server 440 to identify mobile device 405 as well as its user and, optionally, other devices associated with the user. The communication may done by conventional communication platforms available to charging pad 400 (or its associated PTU). If the user is not within immediate viewing of mobile device 405, cloud system 440 may identify the user's other known devices (e.g., laptop 450) and communicate charging deficiency as well as request to relocate mobile device 420 to region 410 of pad 400. To this end, memory 432 may contain other devices associated with user of DUC 405. The system of FIG. 4 may also be used to communicate other information to user's other known devices (e.g., computer 450). For example, information may be communicated when device 405 is completely charged. In one embodiment, a charging map of pad 400 may be sent to computer 450 for the user's viewing. In another embodiment, instructions for relocating mobile device 405 may be relayed to computer 450.

Figure 5:
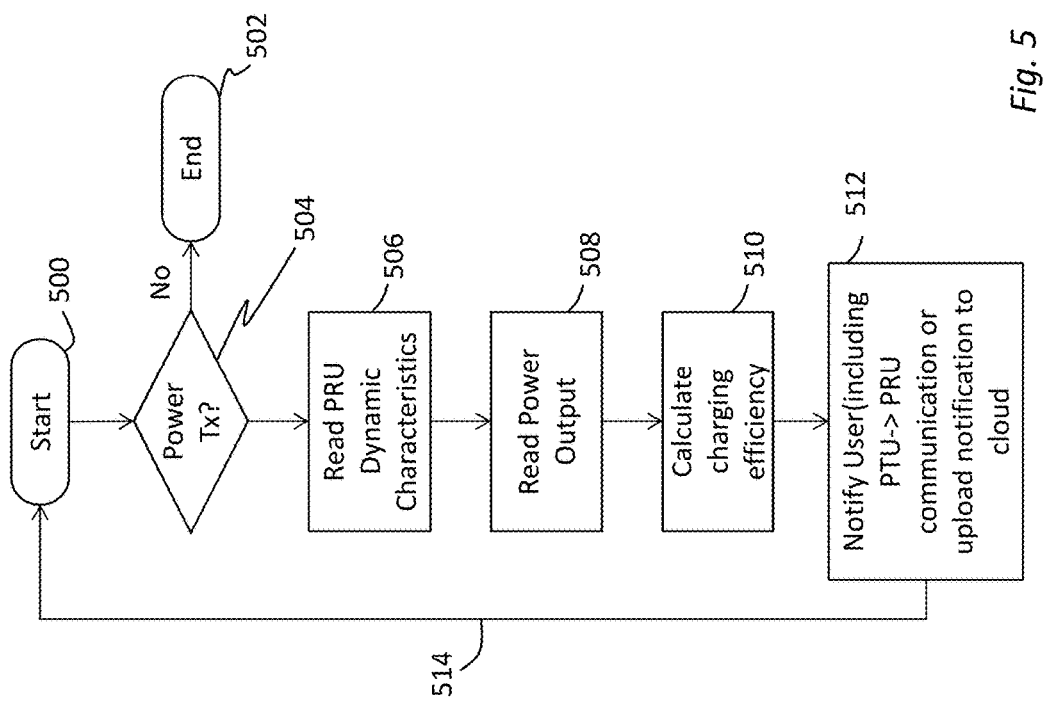
FIG. 5 is an exemplary process flow diagram for implementing an embodiment of the disclosure.

FIG. 5 is an exemplary process flow diagram for implementing an embodiment of the disclosure. The process of FIG. 5 may be implemented at a PTU (including a charging pad) or a processor associated with the PTU. The processor may be hardware, software or a combination of hardware and software. The processor may be configured to implement the exemplary steps outlined at FIG. 5. The process of FIG. 5 starts at step 500. Step 500 may be triggered if a nearby PRU is detected. PRU detection may be done under the A4WP standard. At step 504 determination is made as to whether the PTU is in power transfer state. If the PTU is not in power transfer state, then the process ends at step 502.

On the other hand, if the PTU device is in power transfer mode, then certain dynamic parameter characteristics of the PRU are read as shown at step 506. The dynamic parameter characteristics of the PRU may include, for example, $V_{rect}$ and $I_{rect}$. The PTU may request and receive this information from the PRU under the A4WP Standard. At step 508 the PTU's output power is determined. In an exemplary embodiment, the PTU output power may be defined as a function of the current and voltage output of the PTU's power amplifier. At step 510, the charging efficiency value ($\eta$) is calculated as a function of the dynamic power characteristics and the PTU output power.

Additional determinations can be made after calculating the charging efficiency value. For example, the calculated value may be compared with a predetermined threshold value to determine whether the DUC is being effectively charged. If the comparison shows that the device is not being efficiently charged, the user may be notified to relocate the device to a more efficient charging location. This may mean moving the DUC from a first location on the charging pad to a second location. Device relocation may be implemented with the aid of a charging map and may include directing the user to move the device to a known location. Alternatively, the user may be directed to relocate the device to a new location and the steps of FIG. 5 may be repeated as shown by arrow 514.

In one embodiment of the disclosure, the process of FIG. 5 is repeated after a waiting period as shown by arrow 514. The repeating process may also be triggered by motion sensor (in PTU and/or PRU) when device movement is detected.

For mobile devices having a large display screen (e.g., laptop, tablet, phone, smartwatch, etc.), a charging efficiency map or the calculated charging efficiency may be displayed directly on the device. Additional guidance may also be displayed to the user for relocating the device on the charging pad. In one embodiment, the user may be guided to move the PRU across the charging pad to scan the entirety of the charging pad. For wearable device which may not have a large display screen (e.g., BT/BLE headphones, smart ring, wristband, etc.), special LED lights or sounds may be used to indicate different charging efficiency. In some embodiments, the charging efficiency may be displayed on the small screen associated with the PTU to assist the location selection. In certain embodiments where the mobile device is connected to the cloud, the charging efficiency information and the remaining charge time may be uploaded to cloud. Thus, the user can remotely monitor charging status.

Figure 6:
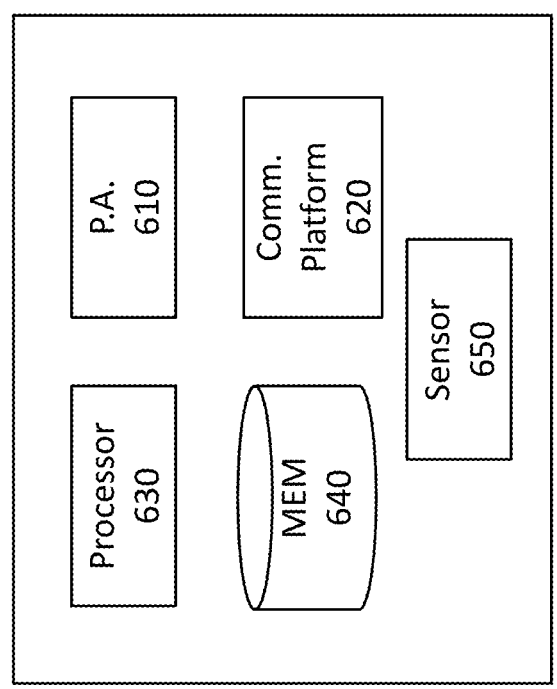
FIG. 6 shows an device for implementing an embodiment of the disclosure.

FIG. 6 shows an device for implementing an embodiment of the disclosure. Device 600 may comprise a charging pad integrated a PTU. Device 600 may be used to improve charging efficiency of a communicating PRU (not shown). Device 600 includes power amplifier 610 to provide electromagnetic output to the PRU. Communication platform 620 may be a conventional BLE system for communicating with the PRU. In an exemplary embodiment, the communication platform may communicate dynamic characteristics from the PRU. The dynamic parameter characteristics may include one or more of voltage ($V_{rect}$) or current ($I_{rect}$) at a rectifier (not shown) associated with the PRU (not shown).

Processor 630 may be an actual or a virtual processor. In one embodiment, processor 630 defines an applet executed on the control system (not shown) of the PTU. Processor 630 may communicate with power amplifier 610 and communication platform 620. Communication platform 620 may convey dynamic characteristics parameters received from the PRU. Processor 630 may also gauge output from power amplifier 610 to calculate a charging efficiency value ($\eta$) for the PRU as a function of the dynamic parameter characteristics and the electromagnetic output of the power amplifier. Processor 630 may be configured to communicate the charging efficiency value ($\eta$) to the PRU.

In one embodiment, the PRU may also receive instructions from PTU to communicate charging efficiency to a cloud server. In another embodiment, the PRU may include an applet that communication the charging efficiency value (η) or any other charging-related information to the cloud upon receipt from PTU 600. In this manner, the PRU's communication platforms (e.g., cellular, WiFi, WiGig, etc.) may be used to broadcast PTU's charging information. The information may include charging map associated with the charging pad. The information may also include charging efficiency value of different locations as the PRU is moved about the charging pad. Thus, the charging efficiency values can be communicated to the cloud as the DUC is moved about the charging pad. The charging efficiency values may also be stored at the could server to construct a charging efficiency map for the charging pad.

The following non-limiting embodiments are presented to illustrate different exemplary embodiments of the disclosure. Example 1 relates to a Power Transmission Unit (PTU) to improve charging efficiency of a Power Receiving Unit (PRU), comprising: a power amplifier associated to provide electromagnetic output to the PRU; a communication platform to communicate dynamic parameter characteristics from the PRU, the dynamic parameter characteristics defining one or more of voltage ($V_{rect}$) or current ($I_{rect}$) received at the PRU; a processor to calculate a charging efficiency value for the PRU as a function of the dynamic parameter characteristics and the electromagnetic output of the power amplifier, the processor further configured to communicate the charging efficiency value to the PRU.

Example 2 relates to the PTU of example 1, wherein the processor is further configured to determine whether the charging efficiency value at the first location is below a predefined threshold and to communicate to a user when the charging efficiency value is below the predefined threshold.

Example 3 relates to the PTU of any preceding example, wherein the processor is further configured to communicate with the user when the charging efficiency value is below the predefined threshold through one or more known devices associated with the user and to direct the user to move the PRU relative a second location proximal to the PTU.

Example 4 relates to the PTU of any preceding example, further comprising a display to communicate charging efficiency information.

Example 5 relates to the PTU of any preceding example, wherein the display is further configured to provide a charging efficiency map of various locations of the PTU.

Example 6 relates to the PTU of any preceding example, wherein the display is further configured to identify PTU locations that provide charging efficiency above and below the threshold.

Example 7 relates to the PTU of any preceding example, further comprising an alarm for sounding a first sound if the charging efficiency value is below the predefined threshold and sounding a second sound if the charging efficiency is above the predefined threshold.

Example 8 relates to the PTU of any preceding example, wherein the communication platform is further configured to direct relocation of the PRU to a second location relative to the PTU when the charging efficiency value at a first location is below the predefined threshold.

Example 9 relates to a non-transitory computer readable medium comprising instructions when executed to cause one or more processor to perform a process comprising: detecting presence of a Power Receiving Unit (PRU) at a first location proximal to a Power Transmission Unit (PTU); receiving dynamic parameter characteristics from the PRU, the dynamic parameter characteristics including one or more of voltage or current received at the PRU and characterized by $V_{rect}$ or $I_{rect}$; determining a power output value at the PTU; calculating charging efficiency value of the PTU as a function of the dynamic parameter characteristics of the PRU and the power output value at the PTU; and communicating the calculated charging efficiency from PTU to PRU.

Example 10 relates to the medium of any preceding example, wherein the instructions further comprise determining whether the charging efficiency value at the first location is below a predefined threshold and indicating when the overall charging efficiency value is below the predefined threshold.

Example 11 relates to the medium of any preceding example, wherein when the charging efficiency value is below the predefined threshold the instructions further comprise communicating with a user associated with the PRU through one or more known devices associated with the user and directing the user to move the PRU relative to the PTU to a second location.

Example 12 relates to the medium of any preceding example, wherein the instructions further comprise displaying the charging efficiency at the PRU.

Example 13 relates to the medium of any preceding example, wherein the instructions further comprise displaying a charging efficiency map at the PRU or at a device associated with the PRU, the charging efficiency map identifying locations with charging efficiency above or blew the predefined threshold.

Example 14 relates to the medium of any preceding example, wherein the instructions further comprise identifying a plurality of PRUs at different locations relative to the PTU and determining an overall charging efficiency value.

Example 15 relates to the medium of any preceding example, wherein the instruction further comprise sounding a first sound if the charging efficiency value is below the predefined threshold and sounding a second sound if the charging efficiency is above the predefined threshold.

Example 16 relates to a method to improve charging efficiency of a Power Transmission Unit (PTU) configured to charge a Power Receiving Unit (PRU), the method comprising: detecting presence of the PRU at a first location proximal to the PTU; receiving dynamic parameter characteristics from the PRU, the dynamic parameter characteristics including one or more of voltage or current received at the PRU and characterized by $V_{rect}$ or $I_{rect}$; determining a power output value at the PTU; calculating charging efficiency value of the PTU as a function of the dynamic parameter characteristics of the PRU and the power output value at the PTU; and communicating the calculated charging efficiency from PTU to PRU.

Example 17 relates to the method of any preceding example, further comprising determining whether the charging efficiency value at the first location is below a predefined threshold and indicating to a user when the charging efficiency value is below the predefined threshold.

Example 18 relates to the method of any preceding example, further comprising communicating with the user when the charging efficiency value is below the predefined threshold through one or more known devices associated with the user and directing the user to move the PRU relative a second location proximal to the PTU.

Example 19 relates to the method of any preceding example, further comprising displaying the charging efficiency at the PRU.

Example 20 relates to the method of any preceding example, further comprising displaying a charging efficiency map to the user, the charging efficiency map identifying locations where the charging efficiency value is above or blew the predefined threshold.

Example 21 relates to the method of any preceding example, further comprising identifying a plurality of PRUs at different locations relative to the PTU and determining the overall charging efficiency.

Example 22 relates to the method of any preceding example, further comprising sounding a first sound if the charging efficiency value is below the predefined threshold and sounding a second sound if the charging efficiency is above the predefined threshold.

Example 23 relates to a machine-readable medium including code, when executed, to cause a machine to perform the method of any one of the preceding example.

Example 24 relates to a Power Transmission Unit (PTU) configured to charge a Power Receiving Unit (PRU), comprising: means for detecting presence of the PRU at a first location proximal to the PTU; means for receiving dynamic parameter characteristics from the PRU, the dynamic parameter characteristics including one or more of voltage or current received at the PRU and characterized by $V_{rect}$ or $I_{rect}$; means for determining a power output value at the PTU; means for calculating charging efficiency value of the PTU as a function of the dynamic parameter characteristics of the PRU and the power output value at the PTU; and means for communicating the calculated charging efficiency from PTU to PRU.

Example 25 relates to the PTU of any preceding example, further comprising means for determining whether the charging efficiency value at the first location is below a predefined threshold and indicating to a user when the charging efficiency value is below the predefined threshold.

Example 26 relates to the PTU of any preceding example, further comprising means for communicating with the user when the charging efficiency value is below the predefined threshold through one or more known devices associated with the user and means for directing the user to move the PRU relative a second location proximal to the PTU.

Example 27 relates to the PTU of any preceding example, further comprising means for displaying the charging efficiency at the PRU.

Example 28 relates to the PTU of any preceding example, further comprising means for displaying a charging efficiency map to the user, the charging efficiency map identifying locations where the charging efficiency value is above or blew the predefined threshold.

Example 29 relates to the PTU of any preceding example, further comprising means for identifying a plurality of PRUs at different locations relative to the PTU and means for determining the overall charging efficiency.

Example 30 relates to the method of any preceding example, further comprising means for sounding a first sound if the charging efficiency value is below the predefined threshold and sounding a second sound if the charging efficiency is above the predefined threshold.

While the principles of the disclosure have been illustrated in relation to the exemplary embodiments shown herein, the principles of the disclosure are not limited thereto and include any modification, variation or permutation thereof.

What is claimed is:

1. A Power Transmission Unit (PTU) to improve charging efficiency of a Power Receiving Unit (PRU), comprising:
a power amplifier associated to provide electromagnetic output to the PRU;
a communication platform to communicate dynamic parameter characteristics from the PRU, the dynamic parameter characteristics defining one or more of voltage ($V_{rect}$) or current ($I_{rect}$) received at the PRU;
a processor to calculate a charging efficiency value for the PRU as a function of the dynamic parameter characteristics and the electromagnetic output of the power amplifier, the processor further configured to communicate the charging efficiency value to the PRU.

2. The PTU of claim 1, wherein the processor is further configured to determine whether the charging efficiency value at the first location is below a predefined threshold and to communicate to a user when the charging efficiency value is below the predefined threshold.

3. The PTU of claim 2, wherein the processor is further configured to communicate with the user when the charging efficiency value is below the predefined threshold through one or more known devices associated with the user and to direct the user to move the PRU relative a second location proximal to the PTU.

4. The PTU of claim 1, further comprising a display to communicate charging efficiency information.

5. The PTU of claim 4, wherein the display is further configured to provide a charging efficiency map of various locations of the PTU.

6. The PTU of claim 4, wherein the display is further configured to identify PTU locations that provide charging efficiency above and below the threshold.

7. The PTU of claim 1, further comprising an alarm for sounding a first sound if the charging efficiency value is below the predefined threshold and sounding a second sound if the charging efficiency is above the predefined threshold.

8. The PTU of claim 3, wherein the communication platform is further configured to direct relocation of the PRU to a second location relative to the PTU when the charging efficiency value at a first location is below the predefined threshold.

9. A non-transitory computer readable medium comprising instructions when executed to cause one or more processor to perform a process comprising:
detecting presence of a Power Receiving Unit (PRU) at a first location proximal to a Power Transmission Unit (PTU);
receiving dynamic parameter characteristics from the PRU, the dynamic parameter characteristics including one or more of voltage or current received at the PRU and characterized by $V_{rect}$ or $I_{rect}$;
determining a power output value at the PTU;
calculating charging efficiency value of the PTU as a function of the dynamic parameter characteristics of the PRU and the power output value at the PTU; and
communicating the calculated charging efficiency from PTU to PRU.

10. The medium of claim 9, wherein the instructions further comprise determining whether the charging efficiency value at the first location is below a predefined threshold and indicating when the overall charging efficiency value is below the predefined threshold.

11. The medium of claim 10, wherein when the charging efficiency value is below the predefined threshold the instructions further comprise communicating with a user associated with the PRU through one or more known devices associated with the user and directing the user to move the PRU relative to the PTU to a second location.

12. The medium of claim 9, wherein the instructions further comprise displaying the charging efficiency at the PRU.

13. The medium of claim 9, wherein the instructions further comprise displaying a charging efficiency map at the PRU or at a device associated with the PRU, the charging efficiency map identifying locations with charging efficiency above or blew the predefined threshold.

14. The medium of claim 9, wherein the instructions further comprise identifying a plurality of PRUs at different locations relative to the PTU and determining an overall charging efficiency value.

15. The medium of claim 9, wherein the instruction further comprise sounding a first sound if the charging efficiency value is below the predefined threshold and sounding a second sound if the charging efficiency is above the predefined threshold.

16. A method to improve charging efficiency of a Power Transmission Unit (PTU) configured to charge a Power Receiving Unit (PRU), the method comprising:
    detecting presence of the PRU at a first location proximal to the PTU;
    receiving dynamic parameter characteristics from the PRU, the dynamic parameter characteristics including one or more of voltage or current received at the PRU and characterized by $V_{rect}$ or $I_{rect}$;
    determining a power output value at the PTU;
    calculating charging efficiency value of the PTU as a function of the dynamic parameter characteristics of the PRU and the power output value at the PTU; and
    communicating the calculated charging efficiency from PTU to PRU.

17. The method of claim 16, further comprising determining whether the charging efficiency value at the first location is below a predefined threshold and indicating to a user when the charging efficiency value is below the predefined threshold.

18. The method of claim 17, further comprising communicating with the user when the charging efficiency value is below the predefined threshold through one or more known devices associated with the user and directing the user to move the PRU relative a second location proximal to the PTU.

19. The method of claim 16, further comprising displaying the charging efficiency at the PRU.

20. The method of claim 16, further comprising displaying a charging efficiency map to the user, the charging efficiency map identifying locations where the charging efficiency value is above or blew the predefined threshold.

21. The method of claim 16, further comprising identifying a plurality of PRUs at different locations relative to the PTU and determining the overall charging efficiency.

22. The method of claim 16, further comprising sounding a first sound if the charging efficiency value is below the predefined threshold and sounding a second sound if the charging efficiency is above the predefined threshold.

* * * * *